United States Patent [19]

Oguey et al.

[11] 4,327,320
[45] Apr. 27, 1982

[54] REFERENCE VOLTAGE SOURCE

[75] Inventors: Henri Oguey, Corcelles; Bernard Gerber, Neuchatel, both of Switzerland

[73] Assignee: Centre Electronique Horloger S.A., Neuchatel, Switzerland

[21] Appl. No.: 105,117

[22] Filed: Dec. 19, 1979

[30] Foreign Application Priority Data

Dec. 22, 1978 [CH] Switzerland ............... 13078/78

[51] Int. Cl.³ .............................................. G05F 1/48
[52] U.S. Cl. .................................. 323/313; 307/304; 323/316
[58] Field of Search ............... 323/16, 22 R, 313–316; 307/297, 304

[56] References Cited

U.S. PATENT DOCUMENTS

| RE. 30,586 | 4/1981 | Brokaw | 323/314 |
|---|---|---|---|
| 3,975,648 | 8/1976 | Tobey et al. | 307/304 |
| 4,041,522 | 8/1977 | Oguey et al. | 307/304 |
| 4,068,134 | 1/1978 | Tobey et al. | 307/304 |
| 4,096,430 | 6/1978 | Waldron | 323/22 R |
| 4,100,437 | 7/1976 | Hoff | 323/314 |
| 4,163,161 | 7/1979 | Walker | 323/22 R |

OTHER PUBLICATIONS

IBM Technical Disclosure Bulletin, vol. 22, No. 4, pp. 1346, 1347, Sep. 1978.

*Primary Examiner*—William H. Beha, Jr.
*Attorney, Agent, or Firm*—Cushman, Darby & Cushman

[57] ABSTRACT

A reference voltage source implemented in silicon-gate CMOS transistor technology comprises a pair of reference transistors of the same conductivity type, the gates of which are made of polycrystalline silicon and differ from each other by the type of doping. The reference voltage can be temperature-compensated by adding an auxiliary compensation voltage source or by establishing a predetermined ratio of current densities in the pair of reference transistors operating in weak inversion.

7 Claims, 12 Drawing Figures

REFERENCE VOLTAGE SOURCE

FIELD AND BACKGROUND OF THE INVENTION

The present invention relates to a reference voltage source to be implemented as a monolithic integrated circuit using CMOS-transistor technology.

Reference sources of this general type have already been proposed, for example in the article of Yannis P. Tsividis and Richard W. Ulmer "A CMOS Reference Voltage Source", published in "1978 IEEE International Solid-State Circuits conference, Digest of Technical Papers", Vol. XXI, pages 48 and 49. According to this proposal a pair of MOS transistors having their gates connected to their drains and operating in the weak inversion region are used to derive from the difference between the voltages across these transistors a voltage having a positive temperature coefficient. This can be added to the voltage of a diode-connected bipolar transistor which has a negative temperature coefficient. This solution however comes out to combine two voltages which are strongly dependent on temperature and it is therefore very difficult, in practice, to obtain a resulting temperature independent voltage, in particular due to the dispersion of parameters in manufacture.

Another reference voltage source has been described by Robert A. Blauschild at al in the above mentioned review, pages 50 and 51, under the title "An NMOS Voltage Reference". This proposal uses the difference between the gate voltages of enhancement and depletion MOS transistors. It allows to obtain a reference voltage stable with temperature but the value of which depends on an implantation process. This process also requires an additional processing step which is applied selectively to one of the transistors and therefore increases the cost of manufacturing complementary silicon-gate transistors in which this step is normally not used.

A reference voltage source is also known (U.S. Pat. No. 3,975,648) which includes two substantially identical insulated-gate field-effect transistors having different flat-band voltage characteristics. These transistors are biased to carry equal drain currents at equal drain voltages and the resulting difference in potential between the gate contacts produces a slightly temperature-dependent reference voltage. However, the implementation of this known reference source is based on the use of different metals or of different semi-conductor materials to form the gates of the transistors. This leads to additional and costly manufacturing steps.

It is further already known that the threshold voltage required to invert a MOS device can be shifted and selectively controlled by using appropriately doped semiconductor material as the gate electrode (U.S. Pat. No. 3,673,471, published German patent application No. DE-OS 2,338,239).

OBJECTS AND SUMMARY OF THE INVENTION

A main object of the invention is to provide a reference voltage source which is compatible with silicon-gate CMOS technology and which is substantially independent of the conditions and tolerances of manufacture and of the conditions of use of the transistors of the circuit. It is in particular an object of the invention to obtain a reference voltage which exhibits a slight dependency of temperature and readily allows to annul the temperature coefficient of the total output voltage of the reference source, and which is furthermore substantially independent of variations of the supply voltage.

In accordance with the invention, a reference voltage source implemented in silicon-gate CMOS transistor technology comprises first and second reference transistors of the same conductivity type, the gates of which are made of polycrystalline silicon and differ from each other by the type of doping. In a first reference transistor the gate is doped in a type opposite to that of the drain and source regions of said transistor, while in a second reference transistor the doping of the gate, drain and source regions is of the same type. The reference transistors are made to operate in the saturated condition and the ratio of their respective drain currents has a predetermined constant value in the steady state of operation. A reference voltage is obtained as the difference between the gate-to-source voltages of said first and second reference transistors.

This reference voltage is thus determined by the difference between the contact potentials of the gates of two reference transistors the structures of which are very similar. The reference voltage therefore depends mainly on a fundamental physical magnitude and is only very slightly dependent on manufacturing tolerances and working conditions, in particular on the supply voltage. The required supply voltage is relatively low, namely in the order of 2 V, and the current consumption of the reference source is also very low. The reference voltage obtained has, accordingly, an equally small value of f.i. about 1.2 V.

The advantages and characteristics of the invention will be better understood from the description of various embodiments given by way of example and illustrated in the accompanying drawings.

DESCRIPTION OF PREFERRED EMBODIMENTS

Figure 1:
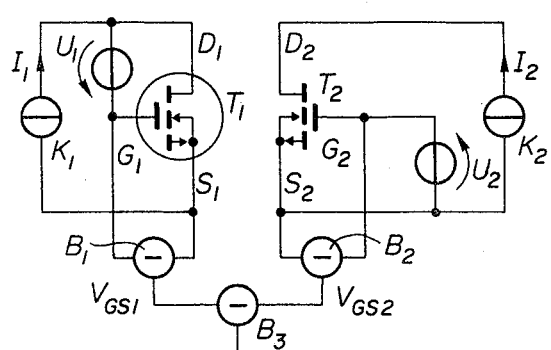
FIG. 1 shows the general diagram of a reference voltage source in accordance with the invention.

Referring to the general basic diagram of FIG. 1, two reference transistors are designated by $T_1$ and $T_2$, respectively. The first transistor $T_1$ is an n-channel MOS transistor, the gate of which is at least in part made of polycrystalline silicon doped in a type opposite to that of the drain and the source regions of this transistor. This specific arrangement is symbolised by a circle around the usual transistor representation. The second reference transistor $T_2$ is also an n-channel MOS transistor, but of a usual type, namely of the type where the gate is made of polycrystalline silicon doped in the same way as the drain and source regions of the transistor. The conduction path between the drain $D_1$ and the source $S_1$ of reference transistor $T_1$ is fed by a first current source $K_1$ providing a current $I_1$, and the voltage between drain $D_1$ and gate $G_1$ of this transistor is defined by a voltage source $U_1$ being substantially stable with respect to variations of current $I_1$. The conduction path of the second reference transistor $T_2$, drain $D_2$-source $S_2$, is fed by a second current source $K_2$ providing a current $I_2$ which is proportional to $I_1$. The voltage between gate $G_2$ and source $S_2$ of this transistor $T_2$ is determined by a controlled voltage source $U_2$. Voltage $U_2$ is controlled by means not represented in FIG. 1, to have a value allowing a desired current $I_2$ to flow through transistor $T_2$. The circuit of FIG. 1 further comprises means shown schematically by $B_1$, $B_2$ and $B_3$ providing a voltage $V_R$ equal to the difference between the gate-to-source voltages of the two reference transistors.

To explain the operation of the circuit, the case is considered where transistors $T_1$ and $T_2$ are realized in respective separate wells, each transistor source being connected to the corresponding well, and where $T_2$ has a low threshold voltage, while transistor $T_1$ has a threshold voltage which is about 1.2 V higher than that of $T_2$. Preferably, $T_1$ and $T_2$ have substantially the same dimensions, namely the same effective length and width of the channel, and the current sources provide currents $I_1$ and $I_2$ of a same very small value, f.i. less than 1 $\mu$A, such that the current densities in the transistors correspond to weak inversion operation. The drain-to-source voltage of $T_1$ is chosen higher than 1.2 V assuring that $T_1$ is in the saturated condition. When equilibrium is attained in the steady state of the circuit, transistor $T_2$ has the same drain-to-source voltage and is also in saturation. The source current/gate-to-source voltage characteristics of both transistors are then of the same shape, but are shifted regarding the voltage by a magnitude equal to the difference $\Delta V$ of the contact potentials of the two types of polycrystalline silicon. As the current sources $K_1$, $K_2$ provide the same current level in both transistors, the difference $V_R$ between the gate-to-source voltages of both transistors, $V_{GS1}$ and $V_{GS2}$, is substantially equal to $\Delta V$.

Figure 2:
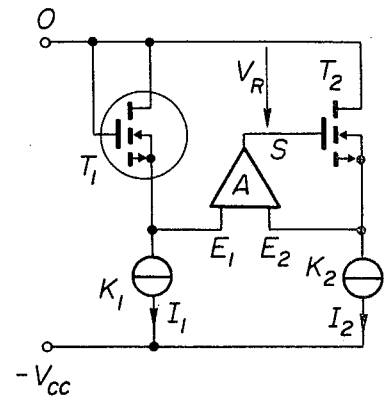
FIG. 2 is a diagram of a first embodiment of the invention.

FIG. 2 schematically shows a practical embodiment of a circuit derived from the general diagram of FIG. 1. In this example voltage $U_1$ is zero, the gate and drain electrodes of $T_1$ being connected together, and said common connection point is connected to terminal 0 (ground) of the supply voltage source, i.e. to the substrate of the transistors. The drain of transistor $T_2$ is also connected to ground and the current sources $K_1$ and $K_2$ are connected in series with the conduction paths of $T_1$ and $T_2$, respectively, between the sources of these transistors and the negative terminal $-V_{CC}$ of the supply voltage source. A differential amplifier A is connected by one input $E_1$ to the source of $T_1$ and by another, inverting input $E_2$ to the source of $T_2$. The output terminal S of the differential amplifier is connected to the gate of $T_2$. In this case, the differential amplifier thus represents the controlled voltage source $U_2$ of FIG. 1 and the reference voltage $V_R$ appears between ground and the gate of transistor $T_2$.

In an alternative embodiment with respect to the case where transistors $T_1$ and $T_2$ are realized in separate wells to avoid any modulation effect of the threshold voltage of these transistors, $T_1$ and $T_2$ can be realized in a same well connected to one of the sources of $T_1$ or of $T_2$ or to a more negative potential. The modulation of the threshold voltages by the potential of the well has the same effect on both transistors, the difference between the gate voltages being not influenced by this potential.

According to another embodiment, $T_1$ and $T_2$ are p-channel transistors, with the drains thereof and the gate of $T_2$ connected to the negative terminal $-V_{CC}$ of the voltage supply source.

Figure 3A:
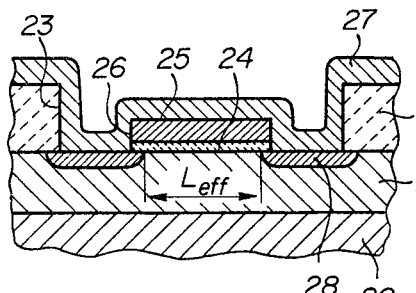
FIGS. 3a and 3b are, respectively, a sectional view and a schematical view from above of a normally doped reference transistor.
Figure 3C:
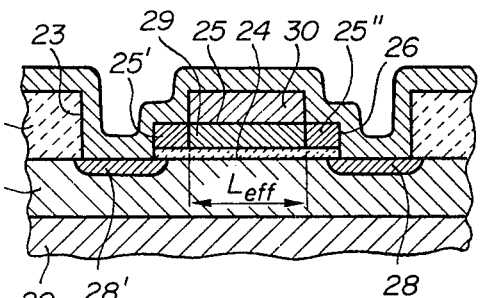
FIGS. 3c and 3d are, respectively, a sectional view and a schematical view from above of a reference transistor with inversely doped polycrystalline silicon-gate.
Figure 3B:
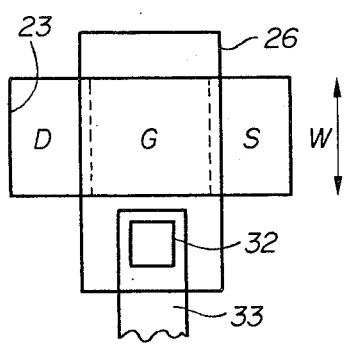
Figure 3D:
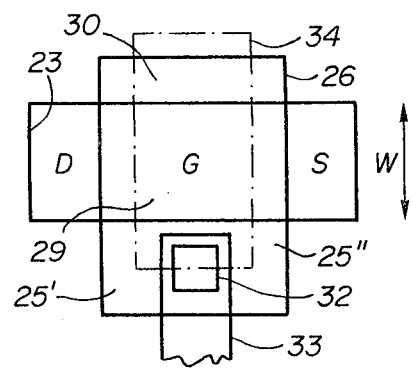

FIGS. 3a and 3b show the structure of a normal n-channel transistor while FIGS. 3c and 3d represent an n-channel transistor with inversely doped polycrystalline silicon-gate.

FIGS. 3a and 3c are sectional views of the transistors and FIGS. 3b and 3d are schematical top views thereof corresponding to the arrangement of the masks used in processing. For both transistors the substrate of the integrated circuit has been designated by 20, the well containing each transistor by 21 and by 22 a thick oxide layer in which openings 23 are arranged for defining the drain, gate and source regions of the transistors. Inside these openings a thin oxide layer 24 is covered by polycrystalline silicon 25.

In the case of the normal transistor shown in FIG. 3a, the drain, source and gate regions are completely covered by a phosphorous-doped oxide layer 27 which after thermal diffusion produces n-doping of the source and drain regions, designated respectively by 28 and 28', up to the border-line 26 of the gate and also n-doping of the whole gate 25. The effective length $L_{eff}$ of the channel of this normal transistor is shown in FIG. 3a while FIG. 3b shows the width W of this channel. Furthermore FIG. 3b shows a gate contact 32 which is placed outside the section shown in FIG. 3a, this gate contact being associated to a metallized part 33.

Regarding the inversely doped polycrystalline silicon-gate transistor $T_1$, FIG. 3c shows the central part of the gate 25 being covered by a boron-doped oxide layer 30 which layer has been selectively etched through a mask 34 (FIG. 3d) so that this oxide layer does not cover the source region 21, the drain region 21' and the edges 25', 25" of the gate over a length of a few microns. The regions thus left free by that oxide are in contact with the phosphorus-doped oxide layer as in the case of a normal transistor. As a result, after diffusion the drain and source regions are doped normally, while the central part 29 of gate 25 is formed by a silicon layer with a complementary type of doping. Such a transistor has a behaviour corresponding to that of three homogeneous transistors connected in series, namely the central transistor with inversely doped polycrystalline silicon-gate and two short transistors with normal polycrystalline silicon-gate. The central transistor has substantially the same behaviour as a normal transistor of the same effective channel length under a same electric field. However, the difference between the contact potential of the p-doped polycrystalline silicon and that of n-doped polycrystalline silicon has the effect that a higher gate voltage must be applied to the central transistor to obtain the same electric field. The influence of the two lateral transistors is negligible as they can be considered as short-circuited if the central transistor operates in weak inversion.

From FIG. 3c it will be seen that the effective channel length is, in the case of the special transistor, the distance between the border-lines of the gate region which is inversely doped with respect to the drain and source regions, while in the case of the normal transistor according to FIG. 3a, this length is represented by the distance between the ends of the lateral diffusions under the gate.

In FIG. 3d the gate contact 32 overlaps regions 25', 25", on the one hand, and 29 on the other hand, and this contact is shown to be associated to a metallized part 33.

A transistor with inversely doped polycrystalline silicon-gate has its gate voltage/drain current characteristics shifted with respect to those of a normal transistor by a well defined voltage value which is approximately 1.2 V. This voltage shifting is well reproduceable when a very high degree of doping is achieved in the polycrystalline silicon for both types of doping. This means in practice that doping is higher than $10^{20}/cm^3$ which corresponds to the degeneration conditions of a semiconductor material.

Figure 4:
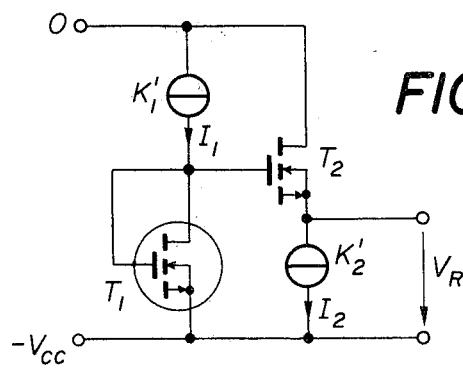
FIG. 4 is a diagram of another embodiment of the reference voltage source of the invention.

FIG. 4 shows schematically another embodiment of a reference voltage source derived from the general diagram of FIG. 1. This embodiment is of a very simple structure. Transistor $T_1$ is connected by its source to the negative terminal $-V_{CC}$ of a supply voltage source, its gate and its drain are connected to a current source $K_1'$ and to the gate of reference transistor $T_2$. The drain of transistor $T_2$ is connected to the other terminal, 0, of the supply voltage source, i.e. to ground. The source of transistor $T_2$ is connected to a second current source $K_2'$. It will be seen that both current sources $K_1'$ and $K_2'$ providing respectively currents $I_1$ and $I_2$, are thus connected in series with the conduction paths of the respective reference transistors.

If $V_{G1}$ and $V_{G2}$ designate the gate voltages and $V_{S1}$ and $V_{S2}$ the source voltages against ground respectively of transistors $T_1$ and $T_2$, it results from the circuit of FIG. 4 that $V_{G1}=V_{G2}$ and further $$V_R - V_{GS1} - V_{GS2} = (V_{G1} - V_{S1}) - (V_{G2} - V_{S2}) = V_{S2} - V_{S1}.$$

The reference voltage $V_R$ thus appears directly between the sources of the reference transistors, means $B_1$ to $B_3$ of FIG. 1 becoming a mere interconnection between the gates of the two transistors and voltage $U_2$ being obtained automatically by the arrangement of transistor $T_2$ as source-follower.

Figure 5:
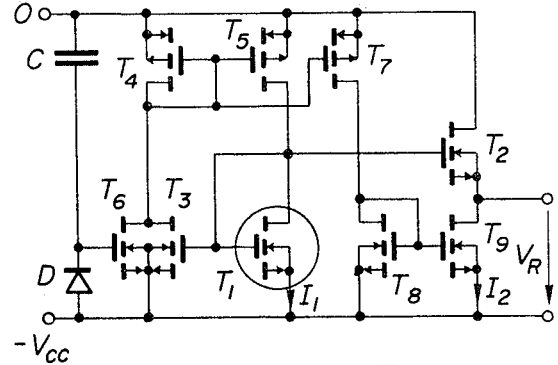
FIG. 5 is a more detailed diagram of the source according to FIG. 4.

FIG. 5 is a more detailed diagram of a reference voltage source based on the circuit of FIG. 4. Current is supplied to transistor $T_1$ through a current supply transistor $T_5$ the conduction path of which is connected in series with that of transistor $T_1$ and which is part of a current mirror $T_4$, $T_5$. A transistor $T_3$ of a type complementary to $T_4$ is connected with its conduction path in series with that of $T_4$, the gate of $T_3$ being connected to that of $T_1$. A transistor $T_6$ of the same conductivity type as $T_3$ is connected by its source and drain connections to those of transistor $T_3$, its gate being connected to the intermediate point of the series connection of a diode D and a capacitor C, which series connection is mounted between the terminals 0, $-V_{CC}$ of the supply voltage source. $T_6$, C and D serve to start the operation of circuit $T_1$, $T_3$, $T_4$, $T_5$. This circuit reaches its stable condition at a ratio of currents through $T_3$ and $T_1$ corresponding to the ratio of currents in the current mirror $T_4$, $T_5$. Transistor $T_3$ is a very low-gain transistor.

The source of transistor $T_2$ is connected to the drain of a transistor $T_9$ the source of which is connected to the negative terminal $-V_{CC}$ and which is part of a current mirror $T_8$, $T_9$. The drain and the gate of the second transistor $T_8$ of this current mirror are connected to the drain of a transistor $T_7$ the source of which is connected to ground and the gate of which is connected to the gates of transistors $T_4$, $T_5$. By this connection of the gates, current $I_2$ flowing through $T_2$ is substantially equal to current $I_1$ flowing through transistor $T_1$.

By way of example, the transistors of FIG. 5 can have the geometrical dimensions given hereunder, where W and L are the effective width and the effective length, respectively, of these transistors and are indicated in microns $T_1$: W/L=100/20
$T_2$: W/L=100/22
$T_3$: W/L=8/660
$T_4$: W/L=200/20
$T_5$: W/L=10/20
$T_6$: W/L=12/8
$T_7$: W/L=10/20
$T_8$: W/L=20/20
$T_9$: W/L=20/20.

In implementing the circuit of this example, both types of polycrystalline silicon were highly doped (about $10^{20}/cm^3$) through the technology used and the following typical results were obtained:

---

$V_R$: mean value 1.164 V, standard deviation: 0.012 V
$I_1 = I_2 = 5$ to 15 nA
Effect of variation of $V_{CC} = 1.8$ to 3 V: $\Delta V_R = 0.001$ V
Effect of variation of T = $-20$ to 80° C.: $\Delta V_R = -0.039$ V.

---

The reference voltages obtained by the circuits described herebefore exhibit a substantially linear variation and are decreasing with temperature. It appears that this variation can be reduced by at least a factor 10 by superimposing a compensation voltage $U_C$ to the supply voltage of transistor $T_1$, which compensation voltage is proportional to absolute temperature T.

Figure 6:
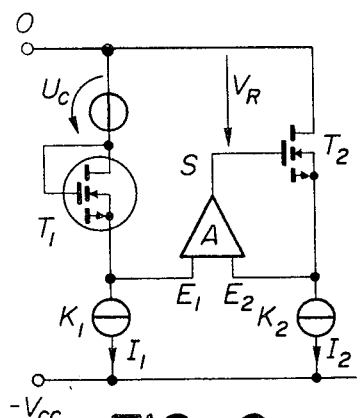
FIG. 6 is a diagram of a temperature-compensated reference voltage source.

FIG. 6 shows the basic diagram of such a temperature-compensated reference voltage source which is derived from the diagramm of FIG. 2. A voltage source $U_C$ proportional to absolute temperature is introduced between ground (0) and the gate of transistor $T_1$. The further circuitry is the same as shown in FIG. 2. A reference voltage $V_R$ is thus provided at the gate of $T_2$ which is equal to the difference between the gate voltages of $T_1$ and $T_2$ increased by the voltage $U_C$. In this circuit the drain of $T_1$ can also be connected to ground as the drain current is very stable with the drain voltage.

Figure 7:
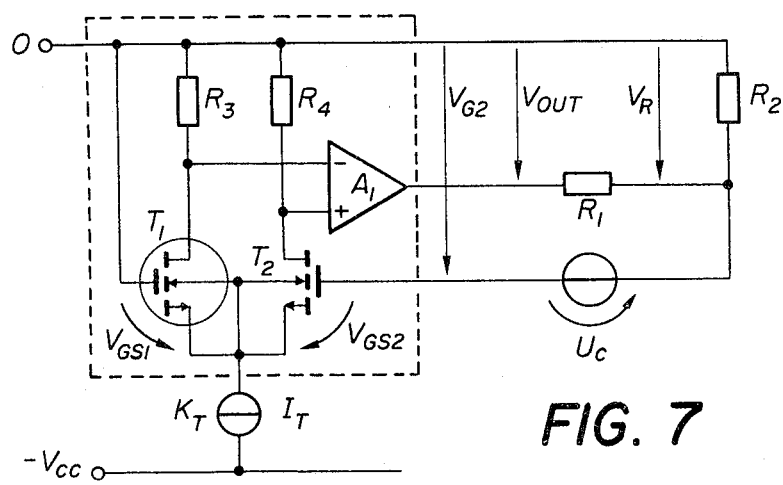
FIG. 7 is the diagram of another embodiment of a temperature-compensated reference source.

FIG. 7 shows another embodiment of a temperature-compensated reference voltage source in which the compensation voltage $U_C$ is not added to the supply voltage of $T_1$ but subtracted from the regulated voltage, thus allowing to use a smaller supply voltage.

In the circuit shown in FIG. 7 transistors $T_1$ and $T_2$ have substantially the same dimensions and are part of the input circuit of a differential amplifier A. The sources of these two transistors are connected to each other and to a current source $K_T$ providing a current $I_T$. The conduction paths of transistors $T_1$ and $T_2$ are connected in series with resistors $R_3$ and $R_4$ respectively, and with the common current source $K_T$ between the terminals 0 and $-V_{CC}$ of a supply voltage source.

The drains of transistors $T_1$ and $T_2$ are connected, respectively, to the input terminals + and − of a differential amplifier $A_1$ the output of which is connected to terminal 0 (ground) through a voltage divider $R_1$, $R_2$. The intermediate point of this voltage divider is connected to the gate of transistor $T_2$ through a compensation voltage source $U_C$ similar to the one mentioned in connection with FIG. 6. An embodiment of such a compensation voltage source will be described in connection with FIG. 9.

The gate of transistor $T_1$, which is made of inversely doped polycrystalline silicon is connected to ground. The current $I_T$ which is provided by the current source $K_T$ is divided between reference transistors $T_1$ and $T_2$, the corresponding current parts flowing through resistors $R_3$, $R_4$ respectively. If these resistors are of equal value, the difference between the voltages at the input of differential amplifier $A_1$ is equal to the difference between the currents flowing through these resistors. This difference is amplified and regulates the gate voltage of transistor $T_2$ so as to reduce this difference to zero, which means that equal currents flow through transistors $T_1$ and $T_2$. When the circuit is thus balanced, the voltage appearing at the intermediate point of voltage divider $R_1$, $R_2$ is equal to $$V_R = V_{GS1} - V_{GS2} + U_C$$

and the output voltage of amplifier $A_1$ $$V_{OUT} = \frac{R_1 + R_2}{R_2} V_R$$

Figure 8:
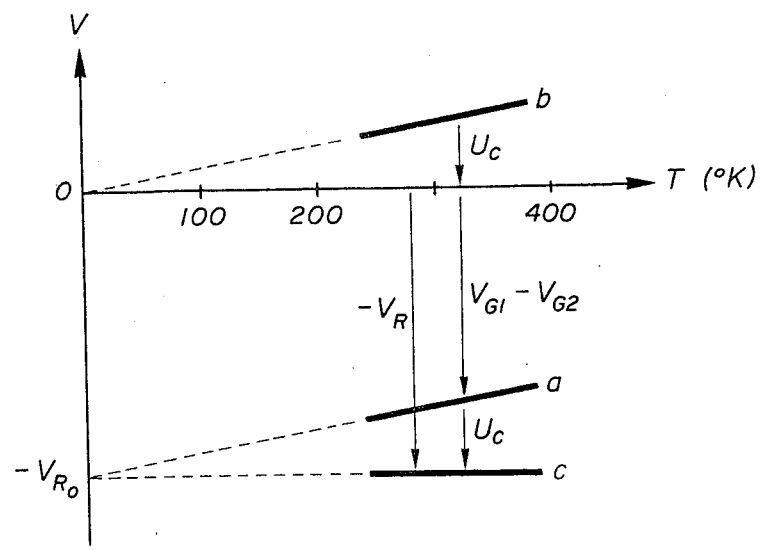
FIG. 8 is a graph showing the variation of voltages used for temperature compensation in the diagram of FIG. 7, as a function of absolute temperature and, FIG. 9 is a detailed diagram of a reference source in accordance with FIG. 7.

FIG. 8 shows the effect of the temperature compensation obtained by the circuits of FIGS. 6 and 7. Curve a represents the difference $V_{G2} - V_{G1}$ between the gate voltages of transistors $T_1$ and $T_2$ carrying equal currents, as a function of absolute temperature T in degrees Kelvin. The measured variation of this difference appears to be approximately linear with temperature. By extrapolation of the straight portion a to T=0, a voltage value $V_{R0}$ is obtained. The source of compensating voltage $U_C$ is adapted to provide a voltage proportional to T represented by a straight line b the slope of which is equal to that of straight curve portion a. When subtracting that voltage $U_C$ from $V_{G2} - V_{G1}$ a reference voltage $V_R$ is obtained which is independent of temperature and equal to $V_{R0}$ (line c).

Voltage divider $R_1$, $R_2$ allows to obtain a temperature compensated output voltage $V_{OUT}$ higher than $V_R$ and easily adjustable to a desired value. Fine adjustment of this output voltage can take place during manufacture allowing to compensate fluctuations of $V_{G2} - V_{G1}$ of a few units percent. A potentiometer can also be used in place of $R_1$ and $R_2$ for obtaining an adjustable reference voltage. If the amplifier $A_1$ is adapted to provide a certain current, a resistive load can be connected to the output of that amplifier without having the output voltage substantially decrease thanks to the small internal resistance of the circuit.

Figure 9:
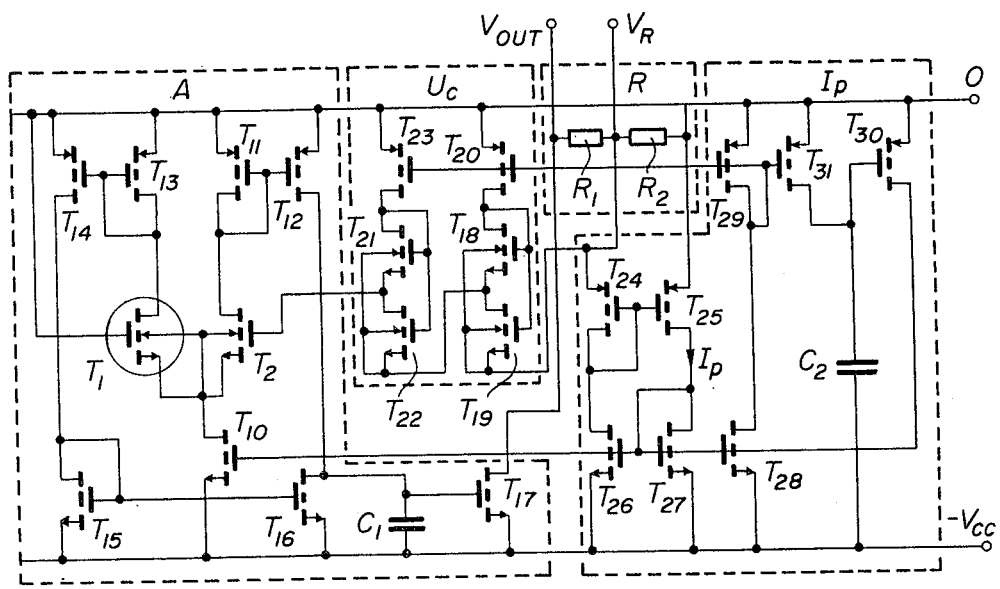

FIG. 9 shows a detailed circuit diagramm of a temperature compensated reference voltage source in accordance with the principle of FIG. 7. The common current source $K_T$ is represented in that diagram by an n-channel transistor $T_{10}$. Resistors $R_3$ and $R_4$ of FIG. 7 are constituted by two p-channel transistors $T_{13}$ and $T_{11}$ the gates of which are connected to the drains of these transistors, respectively. $T_{13}$ and $T_{11}$ thus behave like non-linear resistors. The inputs of amplifier $A_1$ of FIG. 7 are connected to the gates of p-channel transistors $T_{12}$ and $T_{14}$. The conduction pathes of these transistors are connected in series with those of two n-channel transistors $T_{15}$ and $T_{16}$, respectively. The pairs of transistors $T_{13}$, $T_{14}$ and $T_{11}$, $T_{12}$ can be considered as two current mirrors. The advantage of the circuit shown is its small dependency on the technological parameters as it is only influenced by the differences in the characteristics of adjoining transistors. The pair of n-channel transistors $T_{15}$, $T_{16}$ represents a third current mirror, the gates of these transistors being connected to each other and to the drain of transistor $T_{15}$. The current actually flowing between $T_{12}$ and $T_{16}$ is the smaller one of the two currents determined by $T_{11}$ and $T_{13}$. A very small difference between the currents results in a large variation of the common drain voltage of $T_{16}$ and $T_{12}$. This voltage determines the output current of the amplifier which normally flows through the voltage divider $R_1$, $R_2$. In the diagram of FIG. 9 this voltage is applied to the gate of an n-channel transistor $T_{17}$ the source of which is connected to the terminal $-V_{CC}$ of the supply voltage source and the drain of which represents the output terminal of the reference voltage source providing the output voltage $V_{OUT}$. A capacitor $C_1$ is connected between the gate of $T_{17}$ and terminal $-V_{CC}$ to stabilize the operation of amplifier A.

In the diagram of FIG. 9 the p-channel transistors are represented with an inwardly directed arrow at the source connection. All these transistors are realized in a common substrate, not shown. The n-channel transistors are represented with an outwardly directed arrow at the source connection. Were the substrate of these transistors is not shown in the drawing the corresponding transistors are realized in a common well connected to the negative terminal $-V_{CC}$ of the supply voltage source. Those of these transistors which are realized in a separate well are represented with an additional connection bearing an arrow and being connected to the desired potential.

The compensation voltage source $U_C$ can be a PTAT voltage source as described in U.S. patent application Ser. No. 70,494 filed Aug. 28, 1979. As the compensation voltage required in the circuit of FIG. 9 is 4 to 5 times kT/q, a PTAT voltage source of this type having two stages is generally sufficient to effect the temperature compensation. As shown in FIG. 9, two transistors $T_{21}$ and $T_{22}$ are cascade-connected to form a first stage of the compensation voltage source. Transistors $T_{21}$ and $T_{22}$ have a common substrate and the drain of $T_{21}$ is connected to a common connection of the gates thereof. In accordance with the principle described in the above mentioned patent application both transistors are adapted to work in weak inversion and the potential of the common connection point of their conduction pathes is therefore proportional to absolute temperature T. A second pair of transistors $T_{18}$ and $T_{19}$ constitutes a second stage of the compensation voltage source. Transistors $T_{18}$, $T_{19}$ are connected to each other in the same way as transistors $T_{21}$, $T_{22}$. The source of transistor $T_{22}$ is connected to the common connection point of the conduction paths of transistors $T_{18}$ and $T_{19}$, the compensation voltages of the two stages therefore adding to each other. The voltage provided by one stage being limited to about 70 mV at room temperature and the total required compensation voltage being of about 130 mV, two stages are sufficient to provide the total required voltage $U_C$. The transistor pairs $T_{21}$, $T_{22}$ and $T_{18}$, $T_{19}$ are associated respectively to current supply transistors $T_{23}$ and $T_{20}$ which are p-channel transistors having their conduction paths connected in series with those of the respective transistor pairs. The sources of transistors $T_{23}$ and $T_{20}$ are connected to ground and their gates are connected together and to a reference current source $I_p$ which will be described hereafter. By an appropriate choice of the transistor dimensions and of the currents in the compensation voltage source the coefficient of the proportion which $U_C$ bears to temperature T can be made of a desired value.

The reference current source $I_p$ which is part of the diagram of FIG. 9 comprises in particular two p-channel transistors $T_{24}$ and $T_{25}$ and two n-channel transistors $T_{26}$ and $T_{27}$. The conduction pathes of transistors $T_{24}$ and $T_{26}$ are connected in series between the intermediate point of voltage divider $R_1$, $R_2$ and the negative terminal $-V_{CC}$ of the supply voltage source, and the conduction pathes of transistors $T_{25}$ and $T_{27}$ are connected in series between both terminals of this voltage supply source. The gates of $T_{24}$ and $T_{25}$ are connected to each other and to the drain of transistor $T_{24}$, and the gates of transistors $T_{26}$ and $T_{27}$ are connected to each other and to the drain of transistor $T_{27}$.

The drain current of transistor $T_{25}$ is equal to $$I_p = \tfrac{1}{2}\beta_{25}(V_{G25}-V_T)^2$$

where $\beta_{25}$ is the gain of the transistor, $V_{G25}$ is the gate voltage and $V_T$ the threshold voltage thereof. To simplify the explanation it is assumed that the currents in transistors $T_{24}$ and $T_{25}$ are equal thanks to the current mirror formed by transistors $T_{26}$ and $T_{27}$. This means also:

$$I_p = \tfrac{1}{2}\beta_{24}(V_{G25}-V_T-V_R)^2$$

which yields $$I_p = \tfrac{1}{2} V_R^2 \frac{\beta_{24}\beta_{25}}{\left(\sqrt{\beta_{24}}-\sqrt{\beta_{25}}\right)^2}.$$

Current $I_p$ therefore only depends on voltage $V_R$ appearing across resistor $R_2$ and of the gains $\beta_{24}$ and $\beta_{25}$ of transistors $T_{24}$ and $T_{25}$. It is however practically independent of the threshold voltage of these transistors. It can be easily defined to 10-20%, which is sufficient, as the precision of the reference voltage $V_R$ is much higher than that of the currents in the various parts of the circuit. It will be noted that the circuits represented in the parts A and $U_C$ of FIG. 9 provide voltages which depend very little on the currents.

The gates of transistors $T_{10}$ and $T_{27}$ are connected to each other, the transistors thus forming a current mirror which defines the current $I_T$ supplied by transistor $T_{10}$ to transistors $T_1$ and $T_2$ as a function of the reference current $I_p$.

As shown in FIG. 9, block $I_p$ further comprises a p-channel transistor $T_{29}$ and an n-channel transistor $T_{28}$ the conduction pathes of which are connected in series between the terminals of the supply voltage source. The gate of transistor $T_{29}$ is connected to the gates of transistors $T_{23}$ and $T_{20}$ and the gate of transistor $T_{28}$ is connected to that of transistor $T_{27}$. Transistors $T_{27}$ and $T_{28}$ therefore represent a current mirror and bias transistor $T_{29}$ which defines the level of the currents flowing through $T_{23}$ and $T_{20}$.

Transistors $T_{24}$ and $T_{26}$ further have the function of providing a current of opposite direction to that consumed by the compensation voltage source $U_C$. These currents must balance each other precisely in order to comply with the voltage ratio defined by resistors $R_1$ and $R_2$. This can be obtained by appropriate dimensional ratios of transistors $T_{26}$, $T_{28}$, $T_{29}$, $T_{20}$ and $T_{23}$ which must satisfy the following relationship:

$$(S_{23}+S_{20})S_{28}=S_{26}S_{29}$$

where S is the W/L ratio of the transistor designated by the same index.

To allow the circuit to properly start its operation when the supply voltage is switched on, block $I_p$ comprises a starting circuit formed by two p-channel transistors $T_{30}$ and $T_{31}$ and a capacitor $C_2$. The sources of $T_{30}$ and $T_{31}$ are connected to the 0-terminal of the supply voltage source. Capacitor $C_2$ is connected by one connection thereof to terminal $-V_{CC}$ of the supply voltage source and by its other connection to a common connection point of the drain of $T_{31}$ and the gate of $T_{30}$. The drain of transistor $T_{30}$ is connected to the gate of transistor $T_{28}$ and the gate of transistor $T_{31}$ is connected to the drain and to the gate of transistor $T_{29}$. When the supply voltage is switched on, the originally discharged capacitor $C_2$ allows the transistor $T_{30}$ to become conductive and therefore transistor $T_{10}$, $T_{26}$, $T_{27}$ and $T_{28}$ the gates of which are connected to the source of $T_{30}$ also become conductive. When the gates of the corresponding p-channel transistors are sufficiently biased, transistor $T_{31}$ also becomes conductive and charges capacitor $C_2$ thus blocking the starting transistor $T_{30}$. The whole circuit then stabilizes at the current values mentioned before.

The reference voltage $V_R$ provided by the circuit of FIG. 9 and the adjustable voltage $V_{OUT}$ obtained at the voltage divider $R_1$, $R_2$ are very stable for variations of the supply voltage which can take values between 2 and 10 V, and for variations of temperature within the range of $-50°$ and $+100°$ C.

Referring to the basic circuit of FIG. 1 and the circuits of FIGS. 2 and 4 derived therefrom, another solution to obtain a reference voltage $V_R$ independent of temperature allows to avoid the use of an additional compensation voltage source $U_C$. It can be applied even if $U_1=0$ and $U_2=0$ in the diagramm of FIG. 1 and consists in controlling the current densities of the reference transistors in accordance with the following requirements:

(a) currents flowing through transistors $T_1$ and $T_2$ must be sufficiently weak to ensure operation of these transistors in the weak inversion region. The conditions of such operation are described for instance in the article of Eric Vittoz and Jean Fellrath "CMOS Analog Integrated Circuits based on Weak Inversion Operation" published in IEEE Journal of Solid State Circuits Volume SC-12, No. 3, June 1977, p. 224–231.

Equation (12) of this article indicates an order of magnitude for the maximum drain current of a MOS transistor for operation thereof in weak inversion, namely $$I \leq \frac{n-1}{e^2} S \mu C_{ox} U_T^2$$

where I is the drain current, S is the ratio of the effective width to the effective length of the channel, $\mu$ is the effective mobility of the carriers in the channel, $C_{ox}$ is the gate capacitance per unit area, $U_T = kT/q$ is the thermodynamic voltage and n is a slope factor which depends on the ratio of the depletion capacitance to the gate capacitance in accordance with equation (8) of the cited article. For example with
n = 1.7; $(n-1)/e^2 = 0.1$
S = 1
$\mu = 750$ cm$^2$/Vs
$C_{ox} = 45$ nF/cm$^2$
$U_T = 26$ mV.
I must be $\leq 2$ nA.

(b) The current ratio $I_1/I_2$ must have a predetermined value. Reference is again made to the cited article of Vittoz and Fellrath, more particularly to equation (7) thereof, according to which the drain current of a transistor operating in weak inversion can be written $$I = S I_o e^{V_G/nU_T}[e^{-(V_S/U_T)} - e^{-(V_D/U_T)}]$$

where $I_o$ is a characteristic current, $V_G$, $V_S$ and $V_D$ are the gate-to-substrate, source-to-substrate and drain-to-substrate voltages, respectively. The substrate is constituted by a well in the case of an n-channel transistor.

The above equation applies to n-channel transistors $T_1$ and $T_2$ in the following manner. The source of these transistors is connected to the well ($V_s = 0$) and the drains thereof are at a voltage higher by more than $5U_T$ than that of the well. Moreover, the gate of $T_1$ is doped in an opposite manner with respect to the other transistors, thus requiring a gate voltage higher by $\Delta V$ to obtain the same current. This yields $$I_1 = S_1 I_o e^{(V_{G1} - \Delta V)/nU_T}$$

and $$I_2 = S_2 I_o e^{V_{G2}/nU_T}$$

Two different cases can be considered:
1. Current densities are equal in both transistors:

$$I_1/S_1 = I_2/S_2$$

This yields $$I_1 S_2/I_2 S_1 = 1 = e^{(V_{G1} - V_{G2} - \Delta V)/nU_T}$$

or simply $$V_{G1} - V_{G2} = \Delta V$$

In this case, the difference between the threshold voltages corresponds to the difference $\Delta V$ between the contact potentials of the n-doped and of the p-doped polycrystalline silicon gates. At high doping rates this difference corresponds substantially to the width of the forbidden band of silicon, i.e. $E_g/q = 1.12$ V.

It appears that $\Delta V$ is slightly dependent on temperature. This dependency can be represented by the linear function $$\Delta V = V_{Ro} + \alpha T$$

where $V_{Ro} = 1.2$ V, $\alpha = -4.10^{-4}$ V/°K. and T is the absolute temperature in °K.

2. Currents densities are different in $T_1$ and $T_2$:

$$I_1 S_2/I_2 S_1 = e^{(V_{G1} - V_{G2} - \Delta V)/nU_T}$$

The difference between the gate voltages can be written as follows, assuming a linear dependency of $\Delta V$ as above:

$$V_{G1} - V_{G2} = V_{Ro} + T\left(\alpha + \frac{nk}{q} \ln \frac{I_1 S_2}{I_2 S_1}\right)$$

It will be seen that there exists one value of the current ratio for which the expression between brackets becomes zero. The corresponding reference voltage $$V_R = V_{G1} - V_{G2} = V_{Ro}$$

is thus independent of temperature and takes the same value as obtained by extrapolation of the above empirical relationship for $\Delta V$ to T = 0. This way of realizing temperature compensation therefore produces the same effect as the adjunction of an auxiliary voltage source $U_C$. The graph of FIG. 8 also applies to this case.

The above mentioned condition to be fulfilled to obtain the best temperature compensation means that $$I_1/I_2 = (S_1/S_2)e^{-\alpha q/nk}$$

For example
$S_1/S_2 = 1$
$\alpha = -4.10^{-4}$ V/°K.
$k/q = 8.67.10^{-5}$ V/°K.
n = 1.7
$I_1/I_2 = 15$.

In practice, fluctuations occur in the technological parameters of fabrication, resulting in variations of coefficient $\alpha$. Temperature compensation is therefore obtained for a ratio of current densities $I_1 S_2/I_2 S_1$ extending over a certain range, typically from 7 to 30.

We claim:

1. A temperature-compensated reference voltage source comprising first and second reference transistors of the same conductivity type, said first reference transistor having its gate at least in part made of polycrystalline silicon the type of doping of which is opposite to that of the drain and source regions of said first transistor, said second reference transistor having its gate made of polycrystalline silicon the type of doping of which is the same as that of the drain and source regions of said second transistor, said reference transistors ($T_1$, $T_2$) having their sources connected together and through a current defining element ($K_T$) to the first terminal ($-V_{CC}$) of a voltage supply source, the drains of said reference transistors being connected each through a resistor element ($R_3$, $R_4$) to the second terminal (0) of said supply voltage source and being further connected to a respective input terminal of a differential amplifier ($A_1$) the output of which is connected to the said second terminal (0), wherein a circuitry ($U_C$), adapted to generate a compensation voltage increasing with temperature, is connected between the gate of said second reference transistor and the output terminal of said differential amplifier, said compensation voltage being thus subtracted from the potential difference between the gate of said second reference transistor and the second terminal (0) of said supply voltage source, to render the reference voltage ($V_R$) independent of temperature.

2. A reference voltage source as claimed in claim 1, wherein a voltage divider ($R_1$, $R_2$) is connected between the output of said differential amplifier ($A_1$) and the second terminal (0) of said supply voltage source, said circuitry ($U_C$) generating a compensation voltage being connected to apply said compensation voltage between an intermediate point of the voltage divider and the gate of said second reference transistor, an output voltage ($V_{OUT}$) proportional to the reference voltage ($V_R$) appearing across the terminals of the voltage divider ($R_1$, $R_2$).

3. A reference voltage source as claimed in claim 1, wherein said current defining element is a current supply transistor ($T_{10}$) of the same conductivity type as the reference transistor, the conduction path of said current supply transistor being connected between the common connection point of the sources of said reference transistors and the first terminal ($-V_{CC}$) of the supply voltage source, and the gate potential thereof defining the sum of the drain currents of said two reference transistors, and wherein the drains of said reference transistors are connected respectively to the drains of first transistors ($T_{13}$, $T_{11}$) of a first and a second current mirror, said current mirrors each further comprising second transistors ($T_{14}$, $T_{12}$) of a conductivity type opposite to that of the reference transistors, the sources of said first and second transistors of the current mirrors being connected to the second terminal (0) of the supply voltage source and the gates of said first and said second transistors of each current mirror being connected together and to the drain of said first transistors of said current mirrors, the drain of the second transistor ($T_{14}$) of the first current mirror being connected to the drain and to the gate of a first transistor ($T_{15}$) associated with the third current mirror, said first transistor ($T_{15}$) being of the same conductivity type as the reference transistors and being connected by its source to the first terminal ($-V_{CC}$) of the supply voltage source, the drain of said second transistor ($T_{12}$) of said second current mirror being connected to the drain of a second transistor ($T_{16}$) associated with the third current mirror, said second transistor being of the same conductivity type as the reference transistors and being connected by its source and by its gate respectively to the source and to the gate of said first transistor ($T_{15}$) associated with the third current mirror, the drain-to-source voltage of the second transistor ($T_{16}$) associated with said third current mirror representing the output voltage of said differential amplifier ($A_1$).

4. A reference voltage source as claimed in claim 1, wherein said circuitry ($U_C$) generating said compensation voltage comprises at least a pair of transistors of the same conductivity type adapted to operate in weak inversion, each of said pairs comprising a first transistor ($T_{22}$, $T_{19}$) connected by its drain to the source of a second transistor ($T_{21}$, $T_{18}$) of said pair, the gates of the transistors of each pair being connected to each other and to the drain of the second transistor of the pair and the substrates or wells of said transistors of each pair being connected together, the drains of said second transistors of each pair being connected through respective current defining elements ($T_{23}$, $T_{20}$) to the second terminal (0) of the supply voltage source, the drain of the first transistor ($T_{22}$) of the first pair being connected to the gate of said second reference transistor ($T_2$), the source of the first transistor ($T_{22}$) of each pair being connected to the drain of the first transistor ($T_{19}$) of the following pair and the source of said first transistor ($T_{19}$) of the last pair being connected to a point the potential of which varies as a function of the output voltage of the differential amplifier ($A_1$).

5. A reference voltage source as claimed in claim 3, comprising a current reference circuit ($I_p$) adapted to determine at least the sum of the drain currents of said reference transistors, said current reference circuit comprising a first ($T_{25}$) and a second ($T_{24}$) transistor of a conductivity type opposite to that of said current supply transistor ($T_{10}$), a third ($T_{27}$) and a fourth ($T_{26}$) transistor of the same conductivity type as said current supply transistor, the conduction pathes of said first and said third transistors being connected in series between the terminals of the supply voltage source and the conduction pathes of said second and fourth transistors being connected in series between a point the potential of which is a function of the output voltage of said differential amplifier and the first terminal ($-V_{CC}$) of said supply voltage source, the gates of said first and second transistors being connected to each other and to the drain of said second transistor and the gates of said third and fourth transistors being connected to each other and to the drain of said third transistor as well as to the gate of the current supply transistor.

6. A reference voltage source comprising:
first and second reference transistors of the same conductivity type, said first reference transistor having its gate at least in part made of polycrystalline silicon the type of doping of which is opposite to that of its drain and source regions, said second reference transistor having its gate made of polycrystalline silicon the type of doping of which is the same as that of its drain and source regions; and
first and second current defining elements ($K'_1$, $K'_2$) connected in series respectively with the conduction paths of said first and second transistors ($T_1$, $T_2$) between the terminals of a supply voltage source, the source of said first transistor and the drain of said second transistor being connected respectively to opposite terminals of the said supply voltage source and the drain and the gate of said first transistor being connected together and to the gate of said second transistor, the reference voltage ($V_R$) appearing between the sources of said two transistors, and wherein the conduction path of a first current supply transistor ($T_5$) of a conductivity type opposite to that of the first reference transistor ($T_1$) is connected in series with that of said first reference transistor between the drain thereof and a first terminal (0) of the supply voltage source, the conduction path of a second current supply transistor ($T_9$) of the same conductivity type as the second reference transistor ($T_2$) is connected in series with that of said second reference transistor between the source thereof and the second terminal ($-V_{CC}$) of the supply voltage source, said current supply transistors being part, respectively, of a first and a second current mirror ($T_4$, $T_5$; $T_8$, $T_9$) comprising each a second transistor ($T_4$; $T_8$) of the same conductivity type as the corresponding current supply transistor, the gate and the source of said second transistors of said second current mirror being connected, respectively, to the gate and the source of the corresponding current supply transistor, the gates of said second transistors being connected to the respective drains thereof the conduction paths of third transistors (T₃; T₇) of a type opposite to that of the corresponding current supply transistors being connected, respectively, in series with those of the said second transistors of each current mirror, the gate of said third transistor (T₃) associated with said first current mirror being connected to that of said first reference transistor (T₁) and the gate of the third transistor (T₇) associated with said second current mirror being connected to the gate of said first current supply transistor (T₅).

7. A reference voltage source comprising:
first and second reference transistors of the same conductivity type, said first reference transistor having its gate at least in part made of polycrystalline silicon the type of doping of which is opposite to that of its drain and source regions, said second reference transistor having its gate made of polycrystalline silicon the type of doping of which is the same as that of its drain and source regions; and
first and second current defining elements (K'₁, K'₂) connected in series respectively with the conduction paths of said first and second transistors (T₁, T₂) between the terminals of a supply voltage source, the source of said first transistor and the drain of said second transistor being connected respectively to opposite terminals of the said supply voltage source and the drain and the gate of said first transistor being connected together and to the gate of said second transistor, the reference voltage ($V_R$) appearing between the sources of said two transistors, and wherein said first reference transistor is an n-channel transistor comprising within a well (21) spaced n-doped drain and source regions (28, 28'), a thin oxide layer (24) applied to the surface of the well between the said drain and the source regions and being covered by a layer of polycrystalline silicon (25), said layer of polycrystalline silicon comprising a central p-doped part (30) and lateral n-doped parts (35, 36) near the said drain and source regions, said lateral parts being substantially shorter in the direction of the spacing of said regions than the central part (30), said central and said lateral gate parts having a common gate contact region.

* * * * *